United States Patent
Johnson et al.

(10) Patent No.: US 9,476,936 B1
(45) Date of Patent: Oct. 25, 2016

(54) THERMAL MANAGEMENT FOR MICROCIRCUIT TESTING SYSTEM

(71) Applicant: Johnstech International Corporation, Minneapolis, MN (US)

(72) Inventors: David Johnson, Wayzata, MN (US); Jeffrey Sherry, Savage, MN (US); Harlan Faller, St. Anthony, MN (US); Brian Warwick, Ben Lomond, CA (US); Sarosh Patel, Sunnyvale, MN (US); John Bucher, Corcoran, MN (US); Jay Drescher, Marine on St. Croix, MN (US)

(73) Assignee: Johnstech International Corporation, Minneapolis, MN (US)

(*) Notice: Subject to any disclaimer, the term of this patent is extended or adjusted under 35 U.S.C. 154(b) by 298 days.

(21) Appl. No.: 14/211,016

(22) Filed: Mar. 14, 2014

Related U.S. Application Data

(60) Provisional application No. 61/788,530, filed on Mar. 15, 2013, provisional application No. 61/845,107, filed on Jul. 11, 2013.

(51) Int. Cl.
   *G01R 31/28* (2006.01)
(52) U.S. Cl.
   CPC .................. *G01R 31/2891* (2013.01)
(58) Field of Classification Search
   None
   See application file for complete search history.

(56) References Cited

U.S. PATENT DOCUMENTS

| | | | | |
|---|---|---|---|---|
| 3,878,728 A * | 4/1975 | Marzetta | ............... | G01N 25/00 374/102 |
| 5,164,661 A * | 11/1992 | Jones | ................. | G01R 31/2891 219/209 |
| 5,172,049 A * | 12/1992 | Kiyokawa | .......... | G01R 31/2851 219/209 |
| 2002/0093352 A1* | 7/2002 | Min | ................... | G01R 31/2863 324/750.08 |
| 2004/0027147 A1* | 2/2004 | Yamashita | ........... | G01R 1/0408 324/750.08 |
| 2005/0151553 A1* | 7/2005 | Kabbani | ............ | G01R 31/2891 324/750.08 |
| 2005/0206368 A1* | 9/2005 | Lopez | ..................... | G01K 1/16 324/750.07 |

* cited by examiner

*Primary Examiner* — Paresh Patel
(74) *Attorney, Agent, or Firm* — Altera Law Group, LLC

(57) ABSTRACT

The IC test system provides a system and method for thermal management of test pins. A test pin array (22) in a pin guide (24) is mounted in a retainer (20) which is located between an IC wafer (12) which contains IC devices to be tested (DUT) and a load board (40) which provides pathways to test signals to the DUT. On the other side of the load board is a contact plate (50) which together with the retainer straddles the load board. Leg extensions (36) pass through the load board apertures (42) and provide a thermal circuit from the contact plate to the retainer and to the pin array. On the upper side of the contact plate is a cooling/heating system with a thermal electric peltier device (62) and a further heat exchanger (64) as needed. Holes (44) are provided in the legs (36) to provide a supply of dry air to the wafer and pin array to minimize condensation as a result of cooling effects.

7 Claims, 5 Drawing Sheets

THERMAL MANAGEMENT FOR MICROCIRCUIT TESTING SYSTEM

CROSS-REFERENCE TO RELATED APPLICATION

This application claims priority of provisional application No. 61/845,042 filed 11 Jul. 2013 Testing Apparatus and Method for Microcircuit and Wafer Level IC Testing and 61/788,530 entitled filed on 15 Mar. 2013 entitled Prober Enhancements & Prober Capability Interfacing and further hereby is incorporates both disclosures in their entirety into this application

BACKGROUND OF THE INVENTION

1. Technical Field

The present invention is directed to equipment for testing microcircuits.

2. Description of the Related Art

As microcircuits continually evolve to be smaller and more complex, the test equipment that tests the microcircuits also evolves. There is an ongoing effort to improve microcircuit test equipment, with improvements leading to an increase in reliability, an increase in throughput, and/or a decrease in expense.

Mounting a defective microcircuit on a circuit board is relatively costly. Installation usually involves soldering the microcircuit onto the circuit board. Once mounted on a circuit board, removing a microcircuit is problematic because the very act of melting the solder for a second time ruins the circuit board. Thus, if the microcircuit is defective, the circuit board itself is probably ruined as well, meaning that the entire value added to the circuit board at that point is lost. For all these reasons, a microcircuit is usually tested before installation on a circuit board.

Each microcircuit must be tested in a way that identifies all defective devices, but yet does not improperly identify good devices as defective. Either kind of error, if frequent, adds substantial overall cost to the circuit board manufacturing process, and can add retest costs for devices improperly identified as defective devices.

Microcircuit test equipment itself is quite complex. First of all, the test equipment must make accurate and low resistance temporary and non-destructive electrical contact with each of the closely spaced microcircuit contacts. Because of the small size of microcircuit contacts and the spacings between them, even small errors in making the contact will result in incorrect connections. Connections to the microcircuit that are misaligned or otherwise incorrect will cause the test equipment to identify the device under test (DUT) as defective, even though the reason for the failure is the defective electrical connection between the test equipment and the DUT rather than defects in the DUT itself.

A further problem in microcircuit test equipment arises in automated testing. Testing equipment may test 100 devices a minute, or even more. The sheer number of tests cause wear on the tester contacts making electrical connections to the microcircuit terminals during testing. This wear dislodges conductive debris from both the tester contacts and the DUT terminals that contaminates the testing equipment and the DUTs themselves.

The debris eventually results in poor electrical connections during testing and false indications that the DUT is defective. The debris adhering to the microcircuits may result in faulty assembly unless the debris is removed from the microcircuits. Removing debris adds cost and introduces another source of defects in the microcircuits themselves.

Other considerations exist as well. Inexpensive tester contacts that perform well are advantageous. Minimizing the time required to replace them is also desirable, since test equipment is expensive. If the test equipment is off line for extended periods of normal maintenance, the cost of testing an individual microcircuit increases.

Test equipment in current use has an array of test contacts that mimic the pattern of the microcircuit terminal array. The array of test contacts is supported in a structure that precisely maintains the alignment of the contacts relative to each other. An alignment template or board aligns the microcircuit itself with the test contacts. The test contacts and the alignment board are mounted on a load board having conductive pads that make electrical connection to the test contacts. The load board pads are connected to circuit paths that carry the signals and power between the test equipment electronics and the test contacts.

For the electrical tests, it is desired to form a temporary electrical connection between each terminal on the device under test and a corresponding electrical pad on a load board. In general, it is impractical to solder and remove each electrical terminal on the microcircuit being contacted by a corresponding electrical probe on the testbed. Instead of soldering and removing each terminal, the tester may employ a series of electrically conductive pins arranged in a pattern that corresponds to both the terminals on the device under test and the electrical pads on the load board. When the device under test is forced into contact with the tester, the pins complete the circuits between respective device under test contacts and corresponding load board pads. After testing, when the device under test is released, the terminals separate from the pins and the circuits are broken.

Testing of a DUT whether a discrete package or a die from or on a larger wafer requires contact pins of very small dimensions. In the case of wafer level testing the pin size and pin spacing is further reduced, but the test current is the same whether the DUT is a discrete device or a die. As pin size and spacing diminish, the current carrying capabilities likewise diminish. Some test run at high currents or for long periods of time or both, which raises the test pin temperature to a point where either the pin may be damaged from heat or the contact pad may get so hot that it causes solder flow, and solders the pin to the pad.

The solution to this problem has been to slow the test procedure, or allow for cooling time during testing, both of which are undesirable in that they lower throughput.

Cooling the chuck which holds the wafer or DUT is helpful but it does not get to another important source of heat, namely the current flow in the test pins.

Furthermore, any attempt at cooling the wafer may result in condensation which may short or bridge circuits, resulting in damage to the DUT and even, a failed test.

Thus the dual problems of heat at the test pins and condensation from cooling efforts should preferably be solved together.

Complicating a solution is that the test pins themselves are packed too tightly into an array to permit direct access to the pins to cool them. Furthermore, the pins are inaccessible during testing as they are in contact with the DUT.

BRIEF SUMMARY

The following summary is intended to assist the reader in understanding some of the elements of the disclosure, but is not a limitation of the scope of the invention. The claims with their equivalencies are intended for that purpose.

A system for thermal management of test pins in a test array configured to test a device under test (DUT), the test pin array having first ends configured to contact a load board having a plurality of aperture and second ends configured to contact the DUT, the system comprising:
   a. an active heat transfer device having two faces, on face being a cold side and the face being a hot side;
   b. a cooling device atop said heat transfer, said cooling device having at least one surface in contact with the hot side of the heat transfer device; said cooling device having a fluid passage therethrough to supply coolant through the device and thereby draw heat from said hot surface;
   c. a contact plate in abutment with said heat transfer device on one surface and the load board on an opposite surface;
   d. an alignment plate located in abutment with the load board but on a load board face opposite of said connect place; said alignment plate including a central aperture having a peripheral edge for receiving an array/matrix of test pins; said alignment plate further including a plurality of thermal transferring legs sized to pass through said apertures on the load board, said legs sized to engage said contact plate; said alignment plate further including apertures in said legs;
   e. nozzles fitted into at least one of said aperture in said alignment plate; whereby test pins are cooled by the thermal circuit which provides for the removal of heat from the hot side of the thermal transfer device, which in turn removes heat from said contact plate, which in turn removes head from said peripheral edge of the aperture of the alignment plate through the legs, which in turn removes heat from said pin array, thereby allowing the test pins to carry higher currents for longer periods of time than without such cooling.

The system further includes a device wherein nozzle are oriented to provide a flow of dry air to the tips of the test pins to minimize condensation.

The system further includes a device wherein nozzles are oriented to provide a flow of dry air to the DUT to minimize condensation.

The system further includes a device wherein the thermal transfer device is a peltier device.

The system further includes a device wherein the aperture in the retainer includes ledge around its inner periphery to engage said test pin array and to increase the contact surface between the retainer and the array, to increase thermal transfer therebetween.

The disclosure also includes a method of thermal management of a system for testing a device under test (DUT) having an array of test pins configured contact and test a DUT the test pin array having first ends configured to contact a load board having a plurality of aperture and second ends configured to contact the DUT, comprising the steps of:
   a. locating an alignment plate between the DUT and the load board; the alignment plate having a plurality of thermal transfer legs which pass through the load board;
   b. providing a central aperture with an inner peripheral edge in the alignment plate for the pin array;
   c. locating a thermal transfer device adjacent the load board and in contact with said legs said transfer device and alignment plate located such at the load board is sandwiched therebetween, so that said thermal transfer device will transfer heat to or from said test pin array along said peripheral edge, thereby managing the temperature of the pins.

The method also includes providing a flow of dry air to the contact tips of the test pins through said alignment plate and from side of the load board having the transfer device, thereby minimizing condensation on said pin tips.

DETAILED DESCRIPTION OF THE DISCLOSURE

Figure 1:
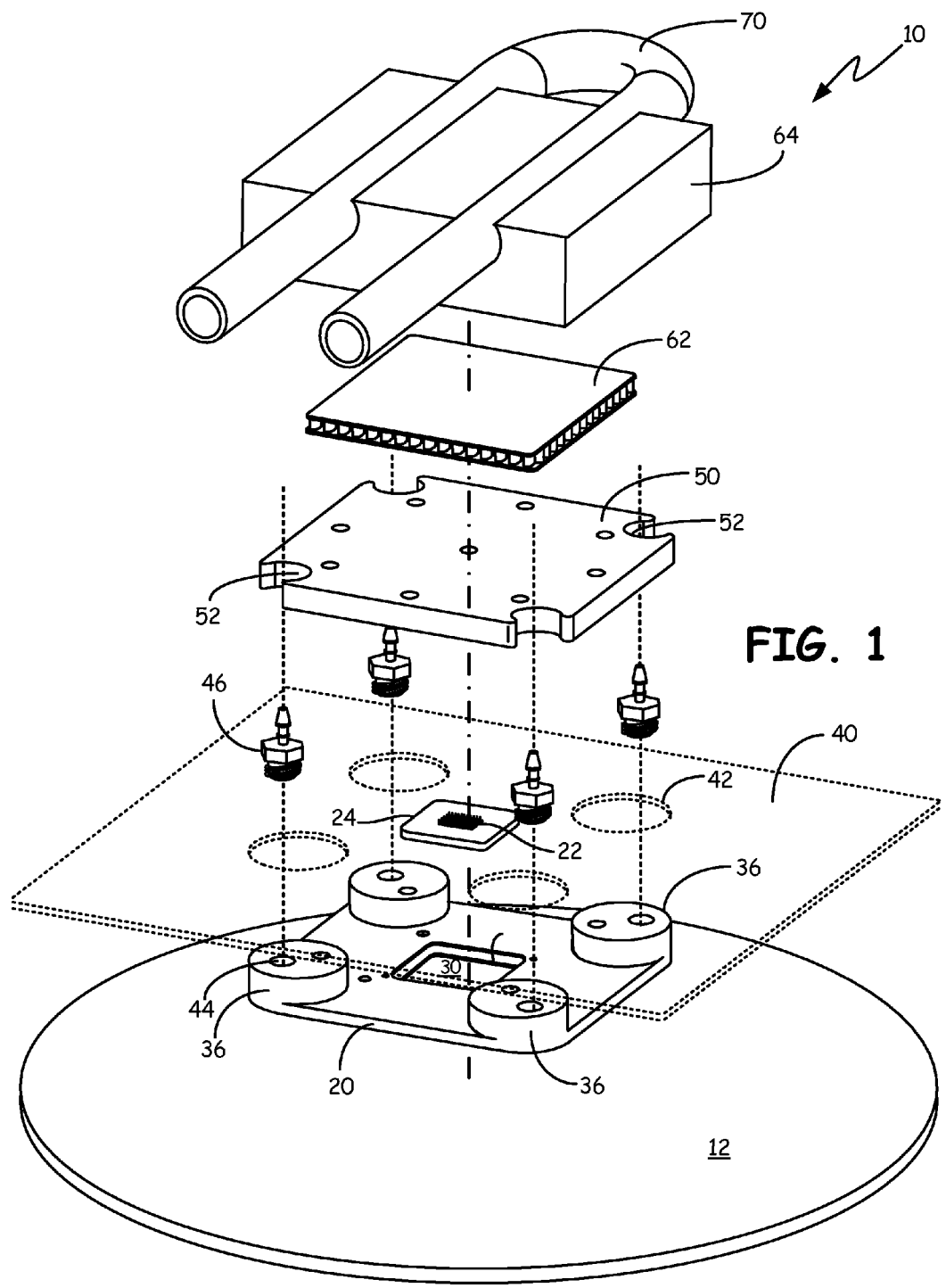
FIG. 1 is an exploded perspective view of a thermal management system.
Figure 2A:
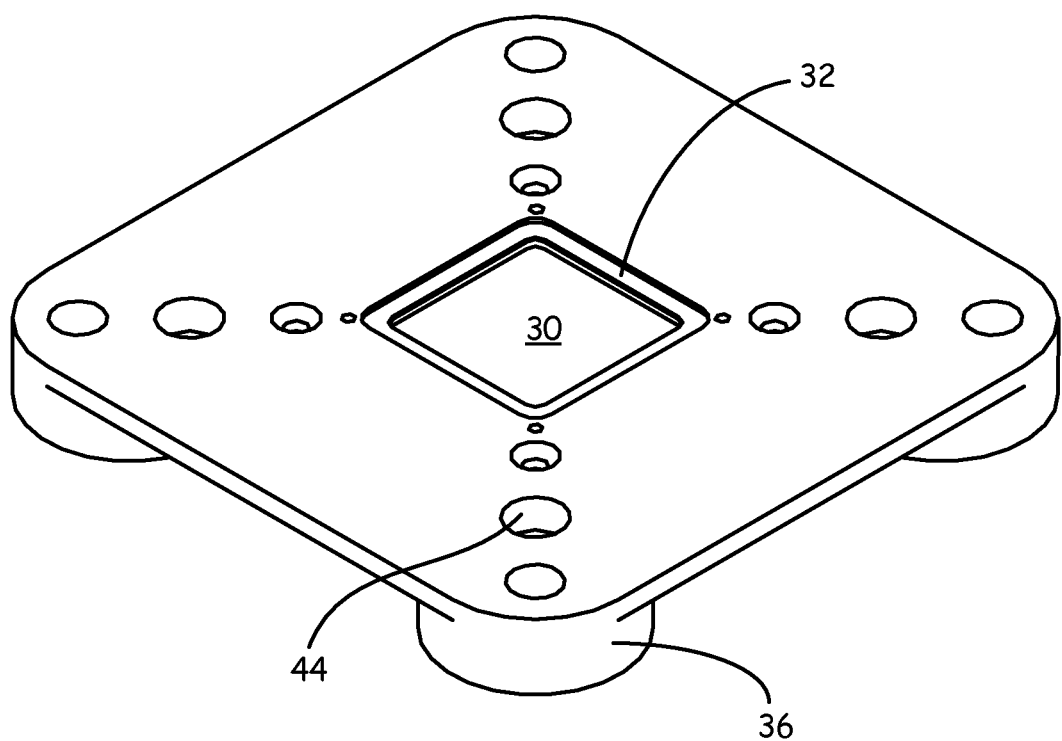
FIG. 2a is a bottom perspective view of the retainer plate.
Figure 2B:
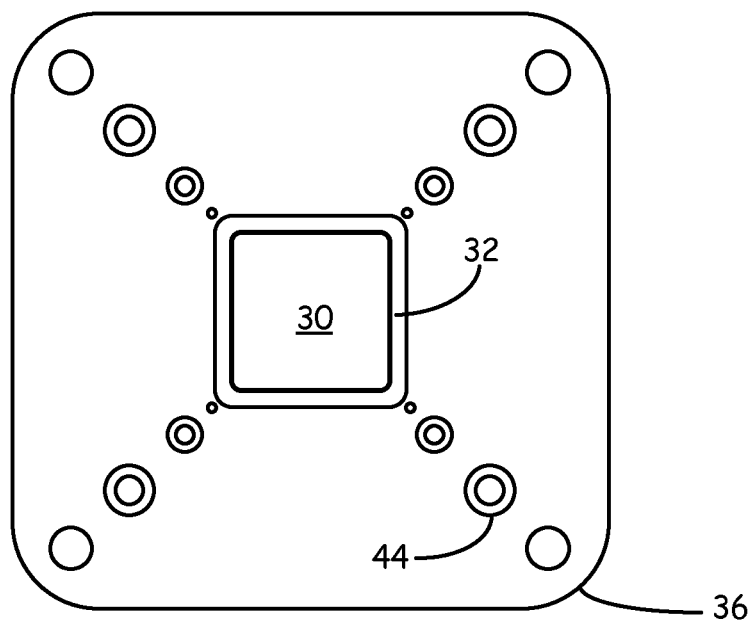
FIG. 2b is a bottom plan view of the retainer plate.
Figure 2C:
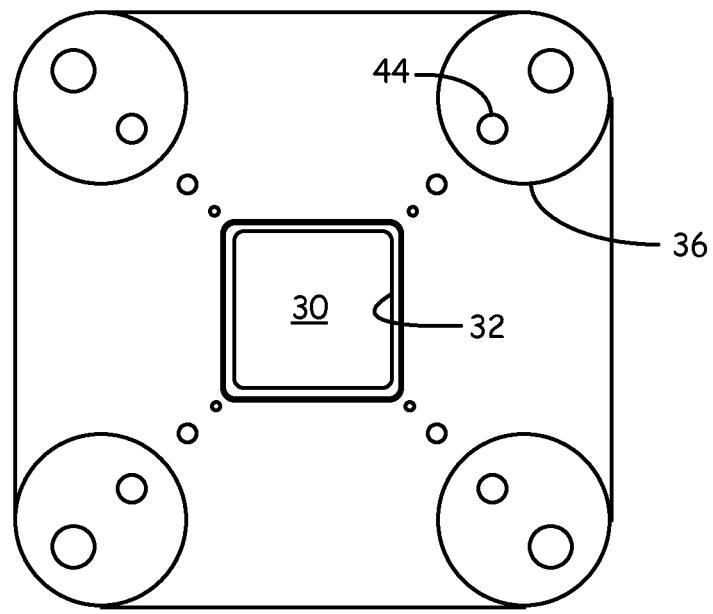
FIG. 2c is a top plan view of the retainer plate.
Figure 3A:
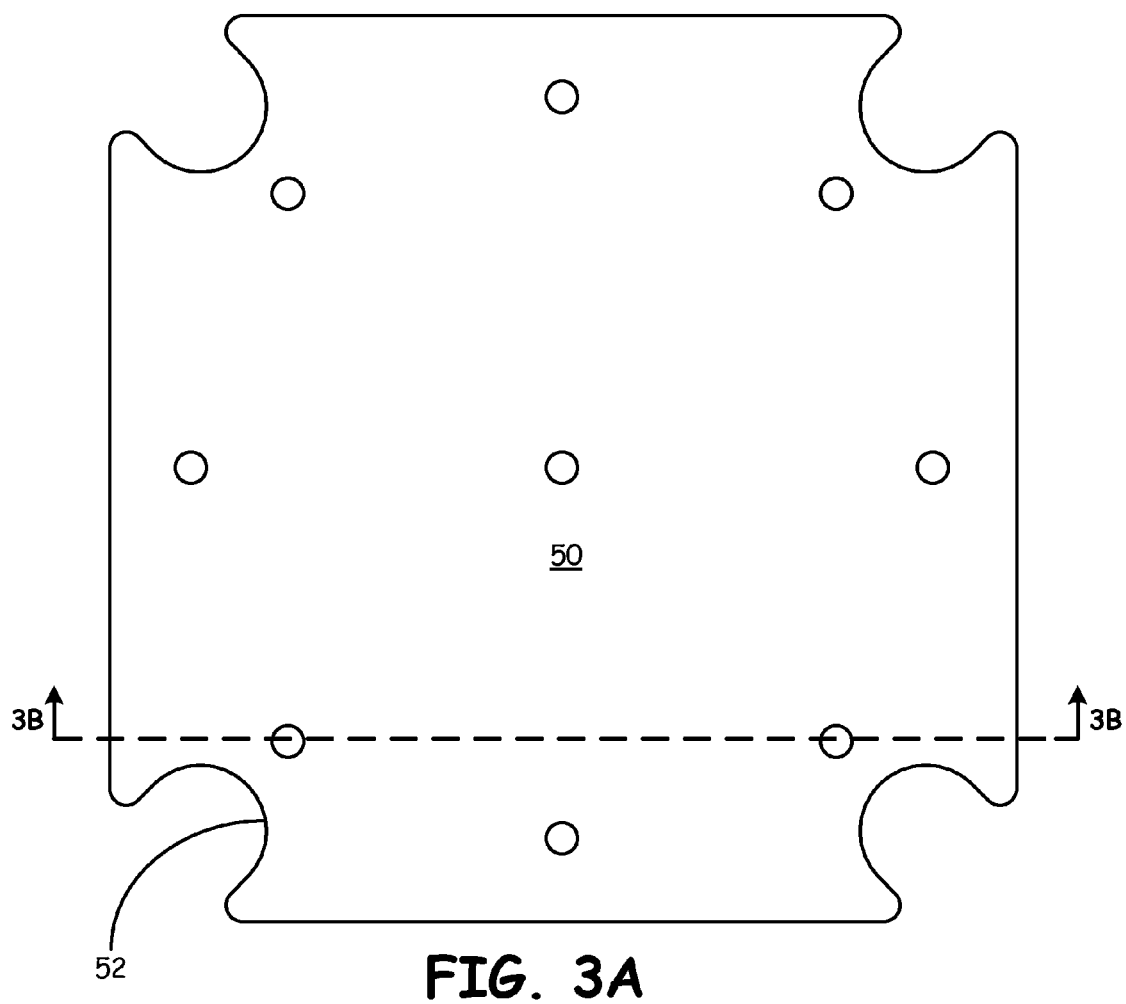
FIG. 3a is a top plan view of the thermal transfer plate.
Figure 3B:
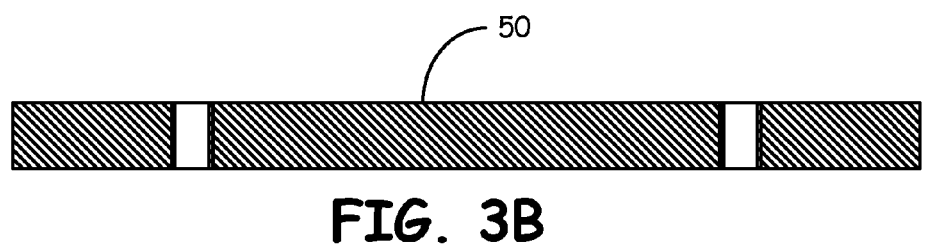
FIG. 3b is a side sectional plan view of FIG. 3a along lines 3b-3b.

Consider an electrical chip, i.e. an integrated circuit that is manufactured to be incorporated into a larger system, whether a discrete device or a die from an IC wafer. When in use, the chip electrically connects the device to the larger system by a series of pins or terminals. For instance, the pins on the electrical chip may plug into corresponding sockets in a computer, so that the computer circuitry may electrically connect with the chip circuitry in a predetermined manner. An example of such a chip may be a memory card or processor for a computer, each of which may be insertable into a particular slot or socket that makes one or more electrical connections with the chip.

It is highly desirable to test these chips before they are shipped, or before they are installed into other systems. It is even more desirable to test the chips while they are still on the wafer from which they were formed. Such chips are called dice or an individual die, which can be tested insitu by a prober (robot) which moves from die to die with an array/matrix of test pins aligned to engage the die pads perfectly. Such component-level or wafer level testing may help diagnose problems in the manufacturing process, and may help improve system-level yields for systems that incorporate the chips. Therefore, sophisticated test systems have been developed to ensure that the circuitry in the chip performs as designed. The chip is attached to the tester, as a "device under test" (DUT), is tested, and is then detached from the tester. In general, it is desirable to perform the probe movement to the die and testing, as rapidly as possible, so that the throughput of the tester may be as high as possible.

The test systems access the chip circuitry through the same pins or terminals that will later be used to connect the chip in its final application. As a result, there are some general requirements for the test system that perform the testing. In general, the tester should establish electrical contact with the various pins or terminals so that the pins are not damaged, and so that a reliable electrical connection is made with each pin.

Furthermore, at the wafer level, the pins are so closely packed together, it is a technical challenge to find a way to connect leads to the probe pins and then on to the load board or equivalent.

A general summary of the disclosure follows.

The terminals of a device under test, DUT, at the wafer level are merely pads on the IC die and are probed by a robotic device which moves a pin array into contact with the die. The contact will be brief but under a predetermined amount of force and the pin array must be able to absorb the force without damage. Then the die/DUT is tested and the pins must carry signals in and out of the chip to a load board, (a term used to characterize the circuit downstream from the pin array, and which may or may not be a physical pc board), and the retract and move to another chip, not necessarily adjacent due to heat dissipation issues.

The load board carries signals to and from the test pins and is often crowded with traces and does not provide much free area for thermal controls. Furthermore the robotic handler which moves the test pin array into and out of contact with the DUT (typically are unseparated die on a wafer) there is little space between the test pins and the load board.

High current test may raise the pin temperature so much that the pin tips may be damaged by heat, and thus there is a need to lower their temperature. In other cases, a high temp test may be required and the pin tips cannot become a heat sink for the DUT. Thus in that case maintaining pin temperature may be important. When referring to thermal management or control, it is assumed that either heating or cooling is included even if only one is mentioned for brevity.

A solution to the problem of thermal control of the test pins is to provide a thermal circuit which traverses the load board so that the bulkier heat exchanger/transfer devices are located on the opposite side of the load board (i.e. the side opposite the pin array, and carry the heat/cooling to the pin array through the legs or other structures which pass through the board. Thus the thermal management systems can be located relatively far from the pin array and still provide substantial thermal management to the array.

Likewise, when thermal management is applied, particularly cooling, there is an increased risk of condensation on the pin tips or the DUT pads. To minimize this risk, a flow of dry air is provided to the DUT and/or pin array. Like thermal management, there is little space on the load board to provide this flow of dry air. The present disclosure provides a pathway through the load board to reach the pins/DUT. In the preferred embodiment, the thermal management system and method include a pathway through the load board to "piggy back" the two benefits without the need to add further pathways through the load board. The pathways (i.e. legs) through the load board which conduct the thermal transfer from outer side of the load board may also have apertures within the legs for air flow.

The preceding paragraphs are merely a summary of the disclosure, and should not be construed as limiting in any way. The test device is described in much greater detail below.

It will be understood that the terms top and bottom may be interchanged as they depend on the user's orientation.

Turning to the figure, FIG. 1 illustrate a thermal controlled test system 10 with a wafer 12 which is typically a wafer disk containing hundreds of individual dies (or dice) separated by intersecting lines which are used as break points for separating the dice into IC chips which are either mounted directly on a printed circuit board (pcb) or put into an IC package with terminals or leads.

The remainder of system 10 will be transported by a robot (a prober) to different locations on the wafer to test each die.

An array of test pins in a pin array 22 are shown in a pin guide plate 24 which itself fits into an aperture 30 in a retainer 20. The aperture includes a ledge 32 which prevents the plate 24 from passing through the retainer and also provides additional contact surface, desirable for thermal transmission, to the array. The ledge is a surface extending from the retainer so that the aperture is stepped from one size to a lesser size.

The retainer may have a plurality of integral legs 36 which extend from its upper surface (the surfaces distant from the wafer) and pass through apertures 42 in the load board 40, (shown in phantom lines to make the remaining parts visible). The legs may also be separated elements which extend through the load board to provide part of the thermal circuit between the pin array and thermal transfer devices. The load board (or other circuit board) provides a pathway for signals to and from the pin array.

Figure 4:
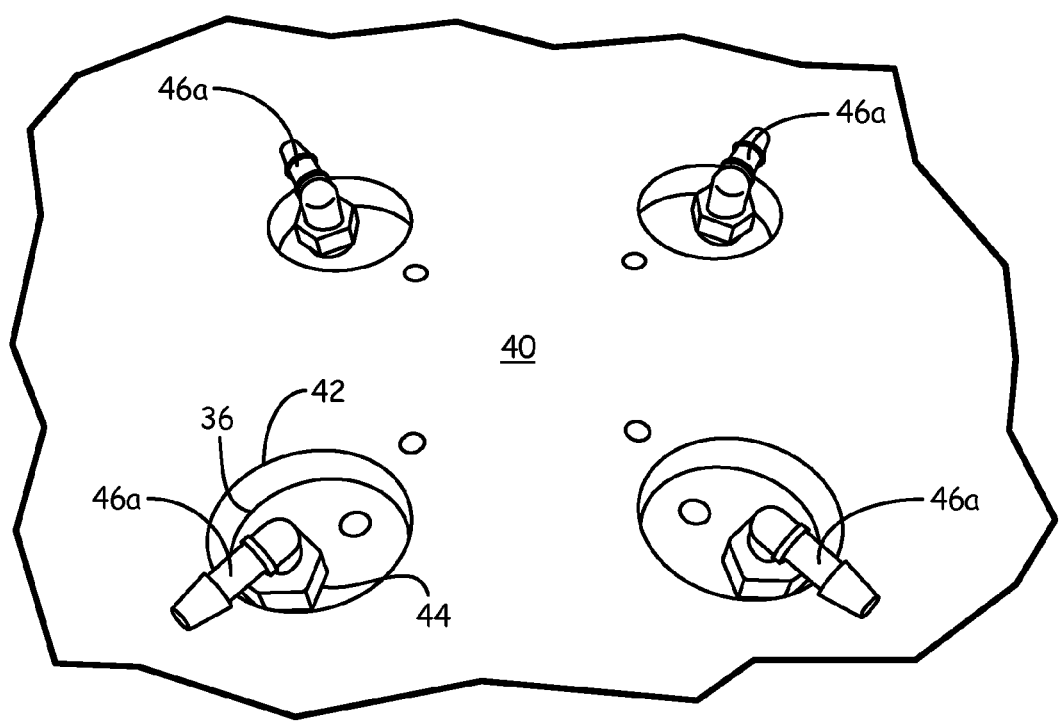
FIG. 4 is a fragmentary top perspective view of a load board and retainer plate with nozzles.

At least one leg includes an aperture 44 for air flow and may be fitted with nozzles 46 (or alternative nozzles 46a in FIG. 4), to which a flow of dry air may be supplied.

On the upper side of the load board is a contact plate 50 which may include curved cutouts 52 which are sized to receive a portion of legs 36 which protrude through the load board. In the preferred embodiment the cutout portions mate closely with the curved portion of legs. It should be understood that the legs need not be cylindrical and the cutouts curved, but that the close contact between whatever shapes are selected will insure maximal thermal transmission. Likewise, the legs could originate on the contact plate and extend to the retainer or be separate elements. The preferred structure will include a high level of thermal transmission/ pathway from the top side of the load board to the lower side of the load board where the pin array is located. Additional holes in contact plate 50 and retainer 20 are provided to secure the parts together through the legs so as to increase the thermal conductivity of the thermal circuit.

A top contact plate 50 is one or more thermal cooling/ heating devices. As previously mentioned, in most cases, the desire is to withdraw heat from the pin array there are circumstances where the opposite may be true. For maximum cooling in the minimum amount of space, a two-step thermal control system is used. A thermoelectric solid state (Peltier) device 62 is in contact with (or may replace) contact plate 50. The cold and hot sides are reversible as known in the art. Atop device 62 is a further cooling/heating sink 64 which will draw heat/cold off the surface device 62 which it abuts. Sink 64 can be provided with a flow tube 70 which can be supplied with coolant/heated fluid, as needed. The two stages thermal transfer system can be reduced to a single stage (either one) but the preferred structure provide the most compact arrangement with the greatest thermal transfer.

If it is important to insulate the load board from the thermal circuit, a thermal insulating material may be fitted on both/either side of the load board so that the contact plate and/or retainer are substantially out of contact therewith. The thermal circuit elements are preferably made of materials with high thermal conductivity, such as aluminum.

In operation, the cooling (or heating) transfer devices 62/64 provides cooling to the surface contacting the contact plate 50 or directly if no plate 52 are used. The thermal connection then extends through the legs 36 to the retainer 20 at to the aperture 30 and ledge 32 which surround the pin array 22. Thus a direct thermal path is created from the pins to the thermal transfer devices which are on opposite sides of the load board.

To minimize condensation on the pins or DUT, a flow of dry air is provided through the nozzles 46/46a from the upper side of the load board and passes through apertures 44 to provide airflow onto the wafer 12, which evaporates condensation as it forms and minimizes the chance that a short will occur as a result of liquid condensation. The nozzles shown are optional, but provide a simple supply hose attachment system.

The pin array/matrix is intended to include any group of test pins and may be part of the retainer without a separate pin guide.

Likewise, while a wafer with dice is shown, individual devices under test can be used with this system and method.

The description of the invention and its applications as set forth herein is illustrative and is not intended to limit the scope of the invention. Variations and modifications of the embodiments disclosed herein are possible and practical alternatives to and equivalents of the various elements of the embodiments would be understood to those of ordinary skill in the art upon study of this patent document. These and other variations and modifications of the embodiments disclosed herein may be made without departing from the scope and spirit of the invention.

The invention claimed is:

1. A system for thermal management of test pins in a test array configured to test a device under test (DUT), the test pin array having first ends configured to contact a load board having a plurality of aperture and second ends of said pins configured to contact the DUT, the system comprising:
    a. an active heat transfer device having two surfaces capable of transferring heat or cold from one surface to the other,
    b. a heat exchanger device atop said heat transfer device, said exchange device having at least one surface in contact with on face of said transfer device and having a fluid passage therethrough to supply thermal fluid through the device;
    c. a contact plate in abutment with said heat transfer device on one surface and the load board on an opposite surface;
    d. an alignment plate located adjacent the load board on a load board face opposite of said contact plate; said alignment plate including an aperture having a peripheral edge for receiving a test pin array;
    e. a plurality of thermal transferring legs sized to pass through said apertures on the load board, said legs extending from said alignment plate to said contact plate and providing a thermal circuit; said legs further including through going apertures
    f. Nozzles fitted into at least one of said aperture in said legs;
whereby test pins are thermally managed by the thermal circuit from the heat transfer device to the test pins through the load board and whereby dry air supplied to the nozzles minimizes condensation at the pin array.

2. The system of claim 1 further including a device wherein nozzle are oriented to provide a flow of dry air to the tips of the test pins to minimize condensation.

3. The system of claim 1 further including a device wherein nozzle are oriented to provide a flow of dry air to the DUT to minimize condensation.

4. The system of claim 1 wherein the thermal transfer device is a peltier device.

5. The system of claim 1 wherein the aperture in the retainer includes ledge around its inner periphery to engage said test pin array and to increase the contact surface between the retainer and the array, to increase thermal transfer therebetween.

6. A method of thermal management of a system for testing a device under test (DUT) having an array of test pins configured contact and test a DUT the test pin array having first ends configured to contact a load board having a plurality of aperture and second ends of said test pins configured to contact the DUT, comprising the steps of:
    a. locating an alignment plate between the DUT and the load board; the alignment plate including a plurality of thermal transfer legs which pass through the load board;
    b. providing a central aperture with an inner peripheral edge in the alignment plate for the pin array;
    c. locating a thermal transfer device adjacent the load board and in contact with said legs said transfer device and alignment plate located such at the load board is sandwiched therebetween,
so that said thermal transfer device will transfer heat/cold to or from said test pin array along said peripheral edge, thereby managing the temperature of the pins.

7. The method of claim 6 further including the steps of providing a flow of dry air to the contact tips of the test pins through said alignment plate and from side of the load board having the transfer device, thereby minimizing condensation on said pin tips.

* * * * *